United States Patent
Suzuki (10) Patent No.: US 9,942,977 B2
(45) Date of Patent: Apr. 10, 2018

(54) HEATSINK-LESS ELECTRONIC UNIT

(71) Applicant: Yazaki Corporation, Minato-ku, Tokyo (JP)

(72) Inventor: Masashi Suzuki, Makinohara (JP)

(73) Assignee: Yazaki Corporation, Minato-ku, Tokyo (JP)

( * ) Notice: Subject to any disclaimer, the term of this patent is extended or adjusted under 35 U.S.C. 154(b) by 0 days.

(21) Appl. No.: 14/810,920

(22) Filed: Jul. 28, 2015

(65) Prior Publication Data

US 2015/0334820 A1  Nov. 19, 2015

Related U.S. Application Data

(63) Continuation of application No. PCT/JP2014/052091, filed on Jan. 30, 2014.

(30) Foreign Application Priority Data

Jan. 30, 2013  (JP) .................................. 2013-016196

(51) Int. Cl.
*H05K 1/02* (2006.01)
*H05K 1/18* (2006.01)

(52) U.S. Cl.
CPC ......... *H05K 1/0209* (2013.01); *H05K 1/0201* (2013.01); *H05K 1/181* (2013.01); *H05K 1/0207* (2013.01); *H05K 2201/09972* (2013.01)

(58) Field of Classification Search
CPC .... H05K 1/181; H05K 1/0201; H05K 1/0207; H05K 1/0209; H05K 2201/09972

USPC ........................................................ 361/777
See application file for complete search history.

(56) References Cited

U.S. PATENT DOCUMENTS

| | | | |
|---|---|---|---|
| 6,373,714 B1 | 4/2002 | Kudoh et al. | |
| 6,605,780 B2 | 8/2003 | Chiriku et al. | |
| 7,488,185 B2* | 2/2009 | Hashikura | H05K 7/026 439/76.2 |
| 7,561,430 B2* | 7/2009 | Tiedemann | H05K 1/0206 174/16.3 |

(Continued)

FOREIGN PATENT DOCUMENTS

| | | |
|---|---|---|
| CN | 101855803 A | 10/2010 |
| JP | 2000-114686 A | 4/2000 |

(Continued)

OTHER PUBLICATIONS

Mar. 4, 2014—International Search Report—Intl App PCT/JP2014/052091.

(Continued)

*Primary Examiner* — Mukund G Patel
(74) *Attorney, Agent, or Firm* — Banner & Witcoff, Ltd.

(57) ABSTRACT

A heatsink-less electronic unit includes a metal coreless electronic substrate, a heatsink-less microcomputer and various semiconductor relays. The heatsink-less microcomputer and the various semiconductor relays are mounted on the metal coreless electronic substrate. The heatsink-less microcomputer is arranged on the metal coreless electronic substrate. Among the various semiconductor relays, the one which may reach the highest temperature is separated at a longest distance from a location where the heatsink-less microcomputer is arranged, and the various semiconductor relays are arranged separately from one another.

5 Claims, 7 Drawing Sheets

(56) References Cited

U.S. PATENT DOCUMENTS

| | | | |
|---|---|---|---|
| 8,310,085 B2 | 11/2012 | Sugimura et al. | |
| 2002/0166690 A1* | 11/2002 | Chiriku | H02G 3/08 |
| | | | 174/60 |
| 2010/0195287 A1* | 8/2010 | Sundstrom | H05K 1/0207 |
| | | | 361/720 |
| 2010/0231038 A1 | 9/2010 | Sugimura et al. | |
| 2011/0061930 A1* | 3/2011 | Kazi | H05K 1/0201 |
| | | | 174/547 |

FOREIGN PATENT DOCUMENTS

| | | |
|---|---|---|
| JP | 2000-277917 A | 10/2000 |
| JP | 2002-293201 A | 10/2002 |
| JP | 2002-315184 A | 10/2002 |
| JP | 2002-330526 A | 11/2002 |
| JP | 2009-130991 A | 6/2009 |
| JP | 2011-014574 A | 1/2011 |

OTHER PUBLICATIONS

Mar. 4, 2014—(WO) Written Opinion of the ISA, Eng Tran.
Sep. 2, 2016—(EP) Extended Search Report—App 14745508.
Sep. 29, 2016—(JP) Notification of Reasons for Refusal—App 2013-016196, Eng Tran.
Mar. 21, 2017—(CN) The First Office Action—App 201480006640.1, Eng Tran.
Apr. 10, 2017—(JP) Notification of Reasons for Refusal—App 2013-016196.

* cited by examiner

HEATSINK-LESS ELECTRONIC UNIT

CROSS REFERENCE TO RELATED APPLICATIONS

This application is a continuation of PCT application No. PCT/JP2014/052091, which was filed on Jan. 30, 2014 based on Japanese Patent Application (No. P2013-016196) filed on Jan. 30, 2013, the contents of which are incorporated herein by reference.

BACKGROUND OF THE INVENTION

1. Technical Field

The present invention relates to an electronic unit which is mounted on a vehicle such as a car and which can be achieved without using any heatsink.

2. Background Art

<Background-Art Measure Against Heat Radiation>

Recently, an electronic unit mounted on a vehicle is requested to be miniaturized due to the limitation of an installation space. In some cases, a plurality of heating components such as semiconductor relays mounted in the electronic unit may thermally interfere with one another and reach very high temperature locally. In order to prevent any electronic component or any electronic substrate from exceeding its upper limit of allowable temperature on this occasion, a heatsink, a metal core substrate, or the like has been used to radiate heat (see JP-A-2011-14574).

<Problem of Background-Art Measure Against Heat Radiation>

As described above, heat radiation performed by use of a heat radiating component such as a heatsink or a metal core substrate is effective as a measure against heat radiation. However, a space for installing the heat radiating component is required. This is against the miniaturization trend. In addition, it is necessary to spend cost for the heat radiating component. The increase of the cost becomes an issue.

The present invention has been accomplished in consideration of the aforementioned circumstances. An object of the invention is to provide a heatsink-less electronic unit in which a measure against thermal interference has been taken into consideration in such a manner that only the layout of heating components is devised without using any heat radiating component such as any heatsink or any metal core substrate to thereby prevent any electronic component or any electronic substrate from exceeding its upper limit of allowable temperature so that deterioration of the electronic component or output stop caused by self-protective shutdown due to overtemperature can be prevented.

SUMMARY OF THE INVENTION

The aforementioned object of the invention can be achieved by the following configurations (1) to (3).
(1) A heatsink-less electronic unit including: a metal coreless electronic substrate; and a heatsink-less microcomputer and various semiconductor relays which are mounted on the metal coreless electronic substrate; wherein: the heatsink-less microcomputer is arranged on the metal coreless electronic substrate; and among the various semiconductor relays, one which reaches a highest temperature is separated at a longest distance from a location where the heatsink-less microcomputer is arranged, and the various semiconductor relays are arranged separately from one another.
(2) A heatsink-less electronic unit including: a metal coreless electronic substrate which is provided with three or more layers of copper foil conductive patterns; and a heatsink-less microcomputer and various semiconductor relays which are mounted on the metal coreless electronic substrate; wherein: the heatsink-less microcomputer and the various semiconductor relays are arranged respectively in end portions of the metal coreless electronic substrate.
(3) The heatsink-less electronic unit according to the aforementioned (1) or (2), wherein: the various semiconductor relays include two or more among from a wiper relay, a head lamp relay and a fog lamp relay.

According to the aforementioned configuration (1), among from the various semiconductor relays, one which may reach the highest temperature is separated at the longest distance from the location where the heatsink-less microcomputer is arranged, and the various semiconductor relays are arranged separately from one another. Therefore, even without using any heatsink or any metal core substrate, it is possible to prevent a plurality of heating components such as the semiconductor relays from thermally interfering with one another and reaching very high temperature locally, and it is also possible to contribute to miniaturization and space saving, in comparison with a background-art device in which a microcomputer provided with a heatsink and various semiconductor relays provided with heatsinks are arranged closely to one another.

According to the aforementioned configuration (2), the heatsink-less microcomputer and the various semiconductor relays are arranged respectively on the end portions of the metal coreless electronic substrate provided with the three or more layers of copper foil conducive patterns. Therefore, even without using any heatsink or any metal core substrate, it is possible to prevent a plurality of heating components such as the semiconductor relays from thermally interfering with one another and reaching very high temperature locally, and it is possible to contribute to miniaturization and space saving, in comparison with a background-art device in which a microcomputer provided with a heatsink and various semiconductor relays provided with heatsinks are arranged closely to one another.

According to the aforementioned configuration (3), the various semiconductor relays include two or more among from a wiper relay, a head lamp relay and a fog lamp relay. The various semiconductor relays which may generate heat respectively during running particularly in the rainy nighttime are arranged separately from one another. It is therefore possible to prevent the various semiconductor relays from thermally interfering with one another and reaching very high temperature locally, and it is possible to contribute to miniaturization and space saving.

BRIEF DESCRIPTION OF THE DRAWINGS

FIGS. 5A and 5B are vertically sectional views of an electronic substrate provided with six layers of copper foil conductive patterns for explaining the background where Embodiment 2 of the invention was created, in which

DETAILED DESCRIPTION OF THE EXEMPLARY EMBODIMENTS

According to the invention, there are provided heatsink-less electronic units in each of which a measure against thermal interference can be taken in such a manner that only the layout of heating components is arranged without using any heat radiating component such as any heatsink or any metal core substrate. As such heatsink-less electronic units, a heatsink-less electronic unit 10 according to Embodiment 1 will be described with reference to FIG. 1A to FIG. 4B and a heatsink-less electronic unit 20 according to Embodiment 2 will be described with reference to FIG. 5A to FIG. 7B.

Embodiment 1

Basic Concept of Embodiment 1

Power losses of semiconductor relays mounted in a heatsink-less electronic unit can be calculated in advance from flowing currents or internal resistances of electronic components.

In addition, a combination of semiconductor relays which may reach highest temperature easily can be known if it is considered what running situation (running in the daytime or the nighttime and running during fine weather or during rainy weather) of a vehicle leads to current conduction to various semiconductor relays.

In addition, it is a matter of course that semiconductor relays to be turned ON for a long time, semiconductor relays to be turned ON for a short time, and semiconductor relays to be turned ON/OFF intermittently can be grasped at the time of design.

In light of these conditions, it has been made clear that any electronic component or any electronic substrate can be prevented from exceeding its upper limit of allowable temperature even without using any heat radiating component such as any heatsink or any metal core substrate when the electronic substrate is designed in consideration of selection of components which should be made to radiate heat by priority in a component mounting area of the electronic substrate and a component layout in which thermal interference may hardly occur among components large in power loss in the same area.

In light of the aforementioned fact, daytime and nighttime are set in a vertical line of a table, and cells of fine weather and rainy weather are provided for each of the daytime and the nighttime. In addition, semiconductor relays (heating components) generating heat when operating are listed in a horizontal line of the table. The table shows how each heating component operates (generates heat) in the daytime and the nighttime and in accordance with a climate state (fine weather or rainy weather) at that time. Each cell is filled with blank when the heating component does not operate at all, with Δ when the heating component operates at a low rate, with ○ when the heating component operates at a normal rate, and with ◉ when the heating component operates at a full rate. In this manner, the following Table 1 is obtained.

TABLE 1

|  |  | Radiator Fan | Head Lamp | Fog Lamp | Wiper | Microcomputer |
|---|---|---|---|---|---|---|
| Daytime | Fine Weather (Outside Temperature = High) | ○ |  |  |  | ◉ |
|  | Rainy Weather (Outside Temperature = Low) | Δ |  |  | ◉ | ◉ |
| Nighttime | Fine Weather (Outside Temperature = Low) | Δ | ◉ |  |  | ◉ |
|  | Rainy Weather (Outside Temperature = Low) | Δ | ◉ | ○ | ◉ | ◉ |

<Way to View Table 1>

From Table 1, it is known that the component which should be made to radiate heat by priority is a microcomputer, the state in which lots of various semiconductor relays operate and reach the highest temperature is the occasion of the "nighttime" in "rainy weather", and the semiconductor relays operating at that time are preferably dispersed and arranged. Among the various semiconductor relays, it is necessary to separate wiper relays, left and right head lamp relays and left and right fog lamp relays from one another and from the microcomputer. The time when radiator fan relays operate at a normal rate is the daytime in fine weather. On this occasion, the wiper relays, the head lamp relays and the fog lamp relays do not operate. Accordingly, there is a degree of freedom for the layout of the radiator fan relays.

\<Background-Art Layout: Front Surface\>

Figure 3A:
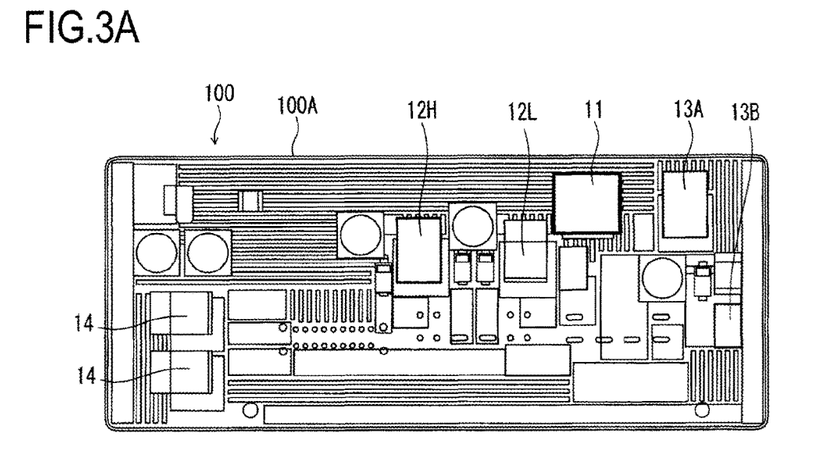
FIG. 3A is a plan view of an electronic substrate in one surface (e.g. front surface) of a background-art electronic unit in which no measure against thermal interference has been taken into consideration.

In a plan view of an electronic substrate 100A in one surface (front surface) of a background-art electronic unit 100 shown in FIG. 3A, a microcomputer 11 and wiper relays (High) 12H and (Low) 12L are arranged closely in the vicinity of the center of the electronic substrate 100A. Radiator fan relays (H+) 13A and (H−) 13B are arranged in the neighborhood of the microcomputer 11.

\<Background-Art Layout: Back Surface\>

Figure 4A:
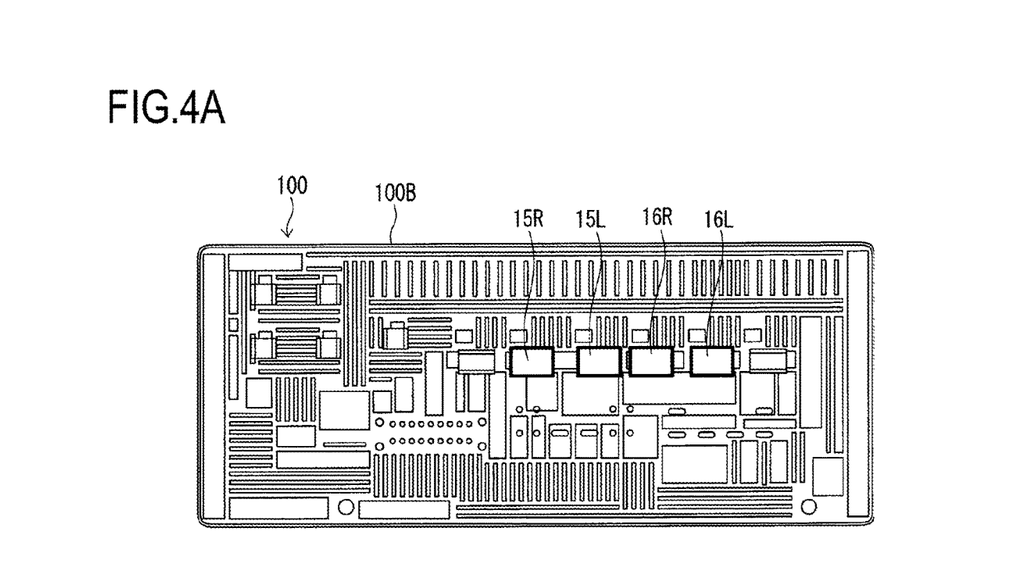
FIG. 4A is a plan view of an electronic substrate in the other surface (e.g. back surface) of the electronic unit shown in FIG. 3A when seen through from the one surface.

In a plan view of an electronic substrate 100B in the other surface (back surface) of the background-art electronic unit 100 shown in FIG. 4A, four relays, i.e. right and left head lamp relays 15R and 15L provided with heatsinks and right and left fog lamp relays 16R and 16L provided with heatsinks are arranged linearly and closely in the vicinity of the center of the electronic substrate.

\<Effect Confirmation\>

Figure 3B:
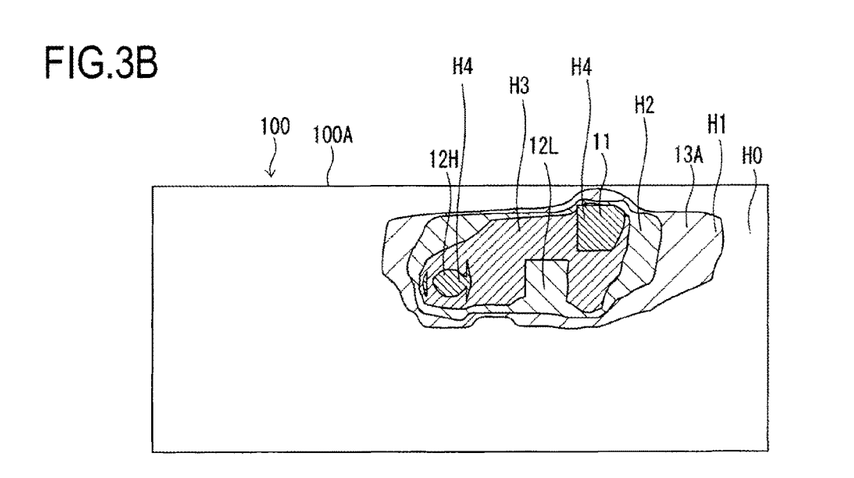
FIG. 3B is a plan view of temperature distribution of the electronic substrate in the one surface of the electronic unit shown in FIG. 3A.
Figure 4B:
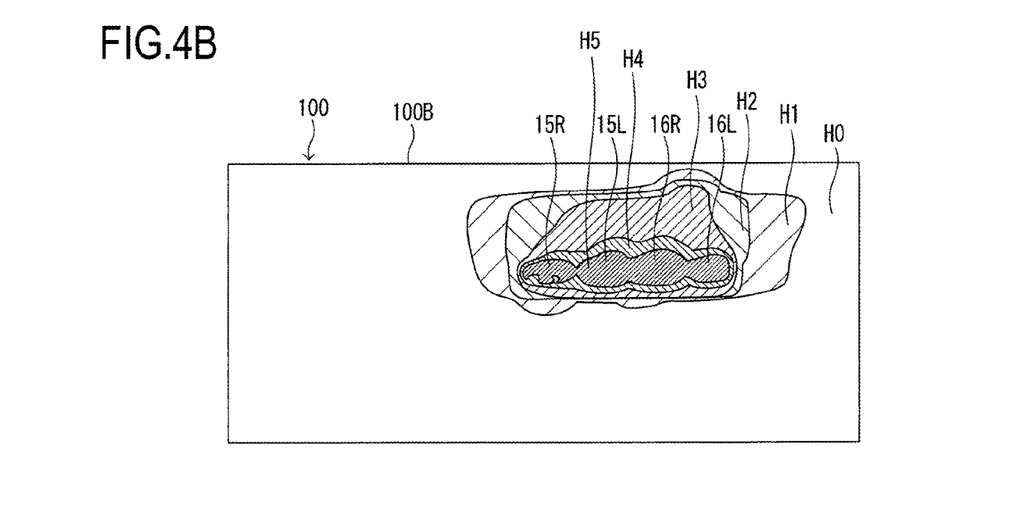
FIG. 4B is a plan view of temperature distribution showing temperature distribution of the electronic substrate in the other surface of the electronic unit shown in FIG. 4A when seen through the one surface.

As a result from the above description, the following temperature distributions can be obtained as temperature distributions of heat generated in the electronic substrates. That is, the electronic substrates 100A and 100B in FIG. 3A and FIG. 4A according to the background art have temperature distributions as shown in FIG. 3B and FIG. 4B respectively. Electronic substrates 10A and 10B in FIG. 1A and FIG. 2A according to Embodiment 1 have temperature distributions as shown in FIG. 1B and FIG. 2B respectively.

In the drawings of the temperature distributions, a plain region H0 designates normal temperature; a diagonally right-up rough hatching region H1 designates slightly higher temperature than the normal temperature; and a diagonally right-down rough hatching region H2, a diagonally right-up fine hatching region H3, a diagonally right-down fine hatching region H4 and a diagonally right-up ultrafine hatching region H5 designate temperatures gradually higher in the named order.

In the electronic substrate 100A shown in FIG. 3A, the microcomputer 11 generating a large amount of heat is arranged closely to the wiper relays (High) 12H and (Low) 12L. Accordingly, in the state in which no heatsink is provided, high temperature regions H4 appear in two places (11 and 12H) and a space between the two places (11 and 12H) is filled with a high temperature region H3, resulting in high temperature over a wide area as shown in FIG. 3B.

In the electronic substrate 100B shown in FIG. 4A, the four relays, i.e. the right and left head lamp relays 15R and 15L and the right and left fog lamp relays 16R and 16L are arranged linearly and closely in the vicinity of the electronic substrate center. Therefore, in the state in which no heatsink is provided, ultrahigh temperature regions H5 appear in the four places (15R, 15L, 15R and 16L) where the relays are located as shown in FIG. 4B.

\<Layout According to Embodiment 1\>

Figure 1A:
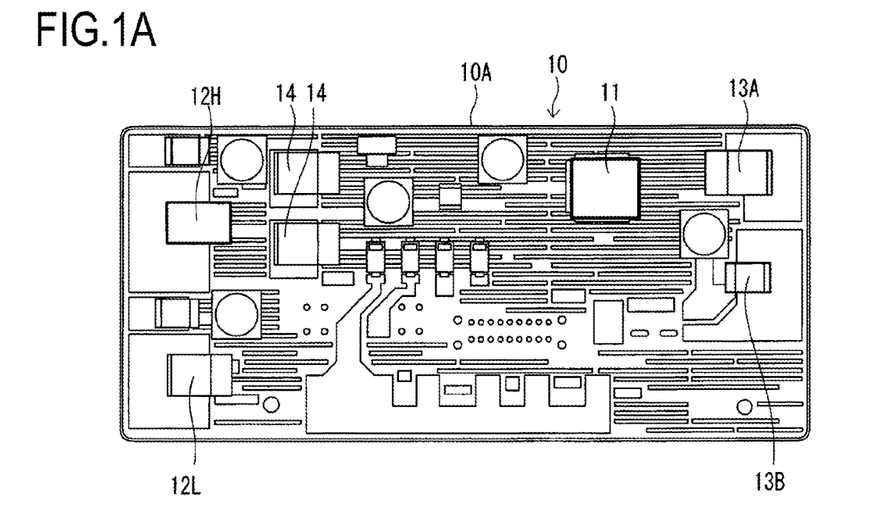
FIG. 1A is a plan view of an electronic substrate in one surface (e.g. front surface) of a heatsink-less electronic unit in which a measure against thermal interference has been taken into consideration according to Embodiment 1 of the invention.
Figure 1B:
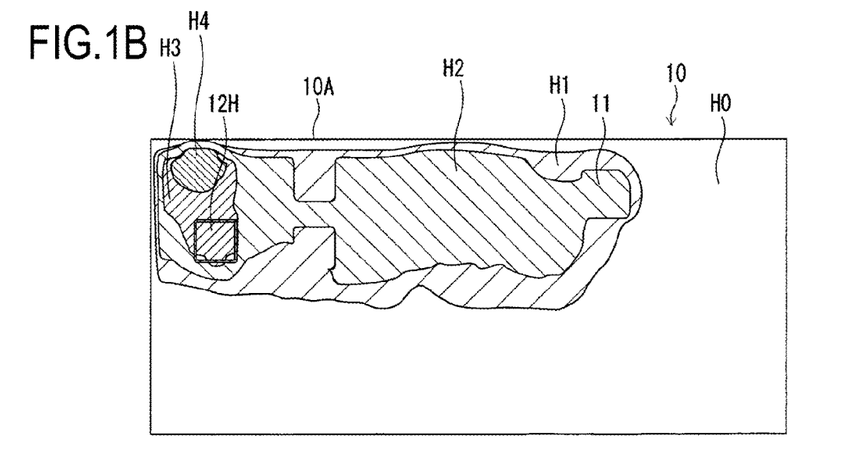
FIG. 1B is a plan view of temperature distribution of the electronic substrate in the one surface of the heatsink-less electronic unit shown in FIG. 1A.

On the other hand, in a heatsink-less electronic unit 10 shown in FIG. 1A according to Embodiment 1 of the invention, a microcomputer (heatsink-less microcomputer) 11 is arranged in substantially the same position in an electronic substrate (metal coreless electronic substrate) 10A. In addition, since washer relays 14 and 14 (see FIG. 3A) which were located in positions largely separated from the microcomputer 11 are little likely to interfere, the washer relays 14 and 14 can be arranged closely to the microcomputer 11 (see FIG. 1A). Wiper relays (High) 12H and (Low) 12L serving as relays which may reach highest temperature among various semiconductor relays and which are highly likely to thermally interfere are arranged in an end portion of the electronic substrate in which the washer relays 14 and 14 are located. Thus, the wiper relays (High) 12H and (Low) 12L are largely separated from the microcomputer 11. The wiper relays (High) 12H and (Low) 12L are also separated from each other.

Figure 2A:
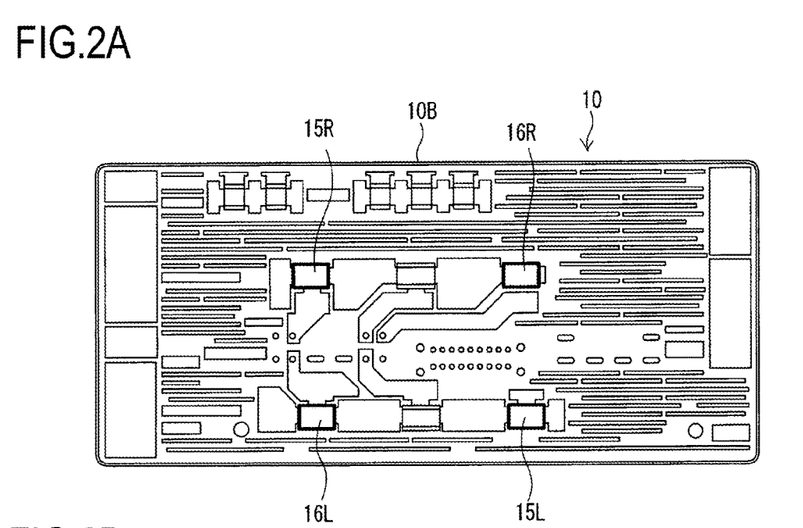
FIG. 2A is a plan view of an electronic substrate in the other surface (e.g. back surface) of the heatsink-less electronic unit shown in FIG. 1A when seen through from the one surface.
Figure 2B:
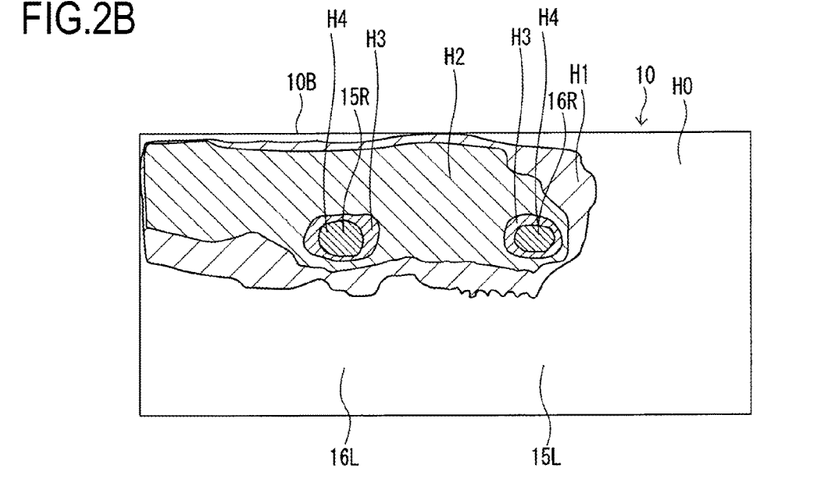
FIG. 2B is a plan view of temperature distribution showing temperature distribution of the electronic substrate in the other surface of the heatsink-less electronic unit shown in FIG. 2A when seen through from the one surface.

According to Embodiment 1 of the invention, in FIG. 2A, a large rectangle is drawn in the vicinity of the center of an electronic substrate (metal coreless electronic substrate) 10B, and right and left head lamp relays 15R and 15L and right and left fog lamp relays 16R and 16L serving as various semiconductor relays are arranged separately and respectively in four corners of the large rectangle. In this manner, heatsinks have been removed.

\<Effect Confirmation\>

In the electronic substrate 10A shown in FIG. 1A, the microcomputer 11 generating a large amount of heat is largely separated from the wiper relays (High) 12H and (Low) 12L. Therefore, only a high temperature region H4 appears in one place in a narrow area while a wide area becomes low temperature regions H2 and H1.

Thus, it is known that thermal interference can be prevented even without using any heatsink and any metal core substrate. In addition, it will go well as long as radiator fan relays (H+) 13A and (H−) 13B are slightly separated from the microcomputer 11.

In addition, in the electronic substrate 10B shown in FIG. 2A, the four relays, i.e. the right and left head lamp relays 15R and 15L and the right and left fog lamp relays 16R and 16L are separated in the four corners of the large rectangle respectively. Therefore, no ultrahigh temperature region H5 appears, but only high temperature regions H4 appear in two places. The remaining wide area becomes low temperature regions H2 and H1. Particularly, the left head lamp relay 15L and the left fog lamp relay 16L located in a side portion of the electronic substrate 10B become normal temperature.

SUMMARY

As described above, according to the heatsink-less electronic unit according to Embodiment 1, components which should be made to radiate heat by priority are selected in a component mounting area of an electronic substrate and a component layout in the same area is considered so that thermal interference may hardly occur among components large in power loss. Thus, the components which should be made to radiate heat by priority or the components large in power loss are separated from one another in the component mounting area of the electronic substrate or components which do not have much influence are disposed closely to the components which should be made to radiate heat by priority or the components large in power loss. In this manner, any electronic component or any electronic substrate can be prevented from exceeding its upper limit of allowable temperature even without using any heat radiating component such as any heatsink or any metal core substrate.

In addition, it is important that components each generating a large amount of heat are also arranged separately from one another in the front and back surfaces as one surface and the other surface of the heatsink-less electronic unit to suppress thermal interference.

Embodiment 2

Basic Concept of Embodiment 2

Figure 5A:
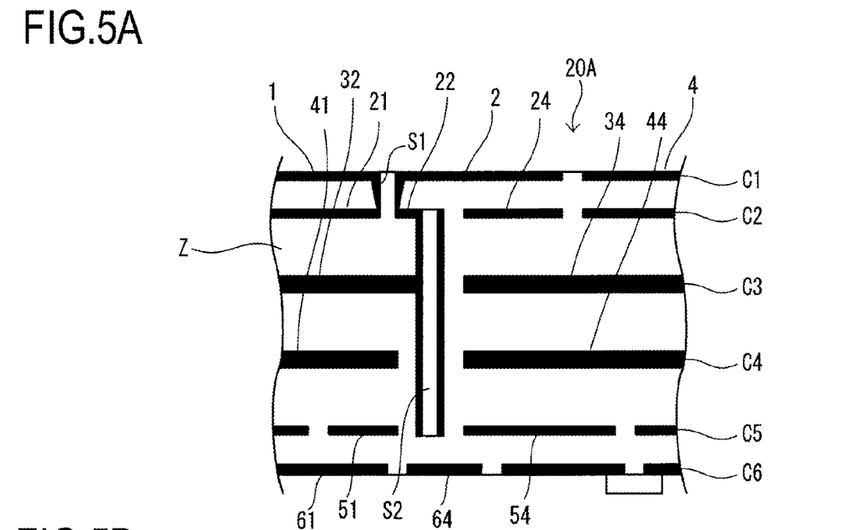
FIG. 5A is a vertically sectional view of the vicinity of a center portion of the electronic substrate and FIG. 5B is a vertically sectional view of an end portion of the same electronic substrate.
Figure 5B:
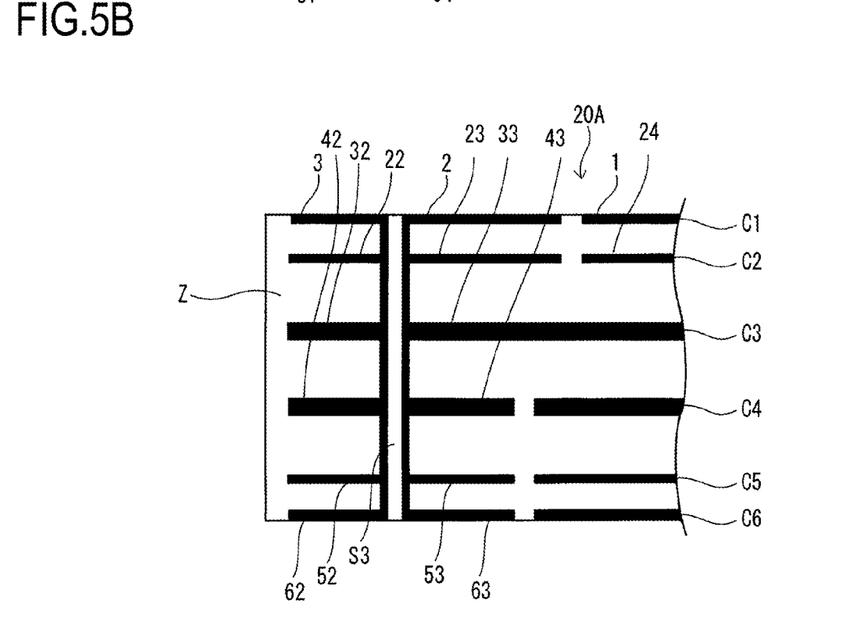

A heatsink-less electronic unit 20 mounted on a vehicle is required to be miniaturized due to the limitation of an installation space. A multilayer insulating plate Z is often used as an electronic substrate (metal coreless electronic substrate provided with three or more layers of copper foil conductive patterns) 20A. For example, consider that the electronic substrate 20A has six layers of copper foils as shown in FIG. 5A and FIG. 5B. In this case, the respective layers of the electronic substrate 20A are often functionally classified as follows.

(1) The first layer C1 and the sixth layer C6 are for mounting of electronic components, arrangement of signal lines, arrangement of output current conducting patterns, thermal dissipation of the electronic components, and an earth circuit for noise suppression.
(2) The second layer C2 and the fifth layer C5 are for arrangement of the signal lines and the earth circuit for noise suppression.
(3) The third layer C3 and the fourth layer C4 are for arrangement of the output current conducting patterns.

In this case, a center area of the electronic substrate as shown in FIG. 5A is a layout area between a microcomputer with a connector and its peripheral circuits. In the center area of the electronic substrate, the microcomputer and the peripheral circuits such as an oscillation circuit, an input interface circuit or an output interface circuit, etc. are mixed and a large number of signal lines connecting these electronic components are also arranged. In addition, there are also a large number of components affecting occurrence of high frequency noise in the microcomputer, the oscillation circuit, etc. and the importance of the earth circuit for noise suppression is also high. Accordingly, copper foils of the respective layers in the insulating plate Z are short respectively and the number of copper foils connected to through holes is also small.

<Copper Foils of Respective Layers in Center Area>

In FIG. 5A, copper foils of respective layers electrically connected to a copper foil 2 of the first layer C1 are only constituted by a copper foil 1 of the first layer C1 connected to a through hole S1, a copper foil 22 of the second layer C2, a through hole S2 connected to the copper foil 22 of the second layer C2, and a copper foil 32 of the third layer C3 connected to the through hole S2.

<Copper Foils of Respective Layers in End Portion>

On the other hand, in FIG. 5B showing an end portion of the electronic substrate 20A, copper foils of respective layers electrically connected to a copper foil 3 of the end portion of the first layer C1 are constituted by the copper foil 2 of the first layer C1 connected to a through hole S3, the copper foil 22 and a copper foil 23 of the second layer C2, the copper foil 32 and a copper foil 33 of the third layer C3, a copper foil 42 and a copper foil 43 of the fourth layer C4, a copper foil 52 and a copper foil 53 of the fifth layer C5, and a copper foil 62 and a copper foil 63 of the sixth layer C6.

<Heat Radiation Area when Electronic Component T is Installed on Copper Foil of First Layer>

Figure 6A:
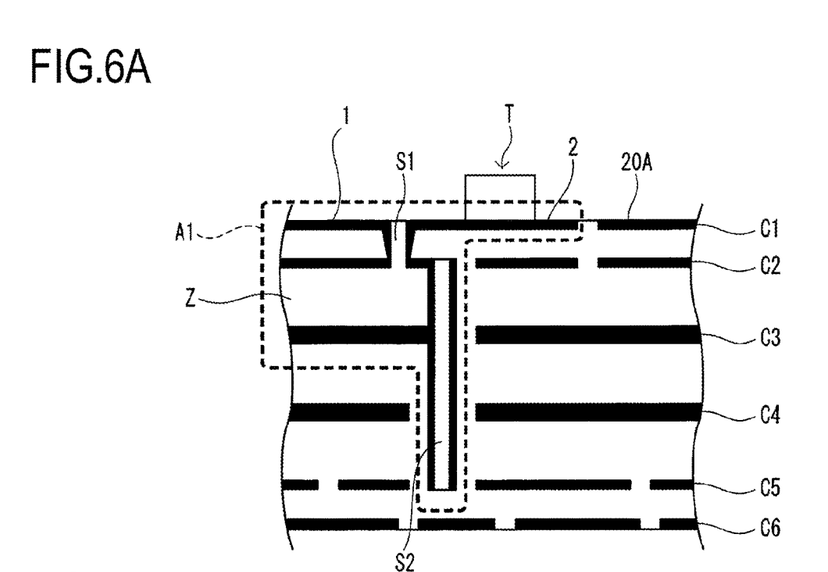
FIG. 6A is a vertically sectional view for explaining a thermal conduction state when a heating component is arranged in the vicinity of the center portion of the electronic substrate shown in FIG. 5A.

Therefore, in focus on this fact, for example, assume that a heating electronic component T such as one of the various semiconductor relays is arranged on the copper foil 2 (see FIG. 5A) in the center area of the first layer C1 of the electronic substrate 20A. In this case, the copper foils of the respective layers of the electronic substrate 20A are cut at short intervals respectively as shown in FIG. 6A. Therefore, there are not a lot of copper foils long enough to dissipate heat. Thus, the copper foils long enough to dissipate heat cannot be made full use of, but a heat radiation area A1 becomes a narrow heat radiation area. As a result, the heat radiation is so low as to cause a local temperature rise around the heating component.

Figure 6B:
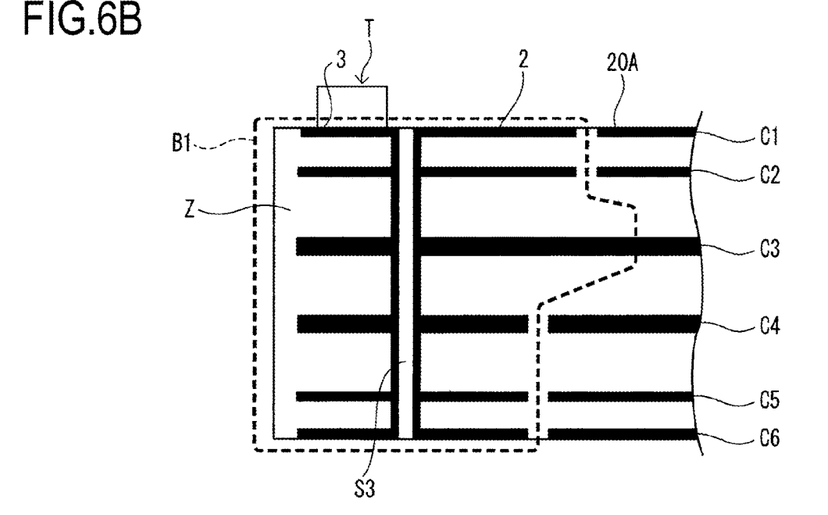
FIG. 6B is a vertically sectional view for explaining a thermal conduction state when a heating component is arranged in the end portion of the electronic substrate shown in FIG. 5B.

On the other hand, assume that the heating electronic component T is arranged on the copper foil 3 (see FIG. 5B) in the end portion of the first layer C1 of the electronic substrate 20A. In this case, the copper foil 2 of the first layer C1, the copper foil 22 and the copper foil 23 of the second layer C2, the copper foil 32 and the copper foil 33 of the third layer C3, the copper foil 42 and the copper foil 43 of the fourth layer C4, the copper foil 52 and the copper foil 53 of the fifth layer C5, and the copper foil 62 and the copper foil 63 of the sixth layer C6 are connected to the copper foil 3 through the through hole S3 as described above. Thus, a heat radiation area B1 becomes a wide heat radiation area as shown in FIG. 6B.

In this manner, the heat radiation effect is so large that the local temperature rise around the heating component can be suppressed and the temperature rise inside the electronic unit can be dispersed (equalized).

<Specific Layout>

Figure 7A:
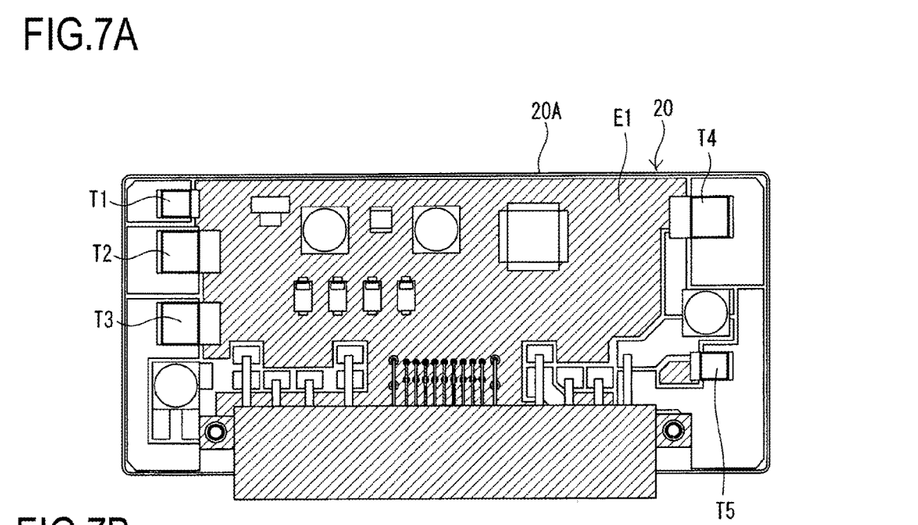
FIG. 7A is a plan view of an electronic substrate in one surface (e.g. front surface) of a heatsink-less electronic unit in which a measure against thermal interference has been taken into consideration according to Embodiment 2 of the invention.

In Embodiment 2, as shown in FIG. 7A, heating components T1 to T3 are arranged in an end portion of an electronic substrate 20A in one surface (front surface) of a heatsink-less electronic unit 20, and heating components T4 and T5 are arranged in the other end portion thereof. On the other hand, no heating component is arranged in the vicinity (hatching portion) of the center of the electronic substrate 20A as an arrangement area E1 for control components and signal lines. Thus, a measure against thermal interference can be taken in such a manner that only the layout of the heating components in the end portions of the electronic substrate is arranged without using any heat radiating component such as any heatsink or any metal core substrate in the same manner as in the aforementioned Embodiment 1.

Figure 7B:
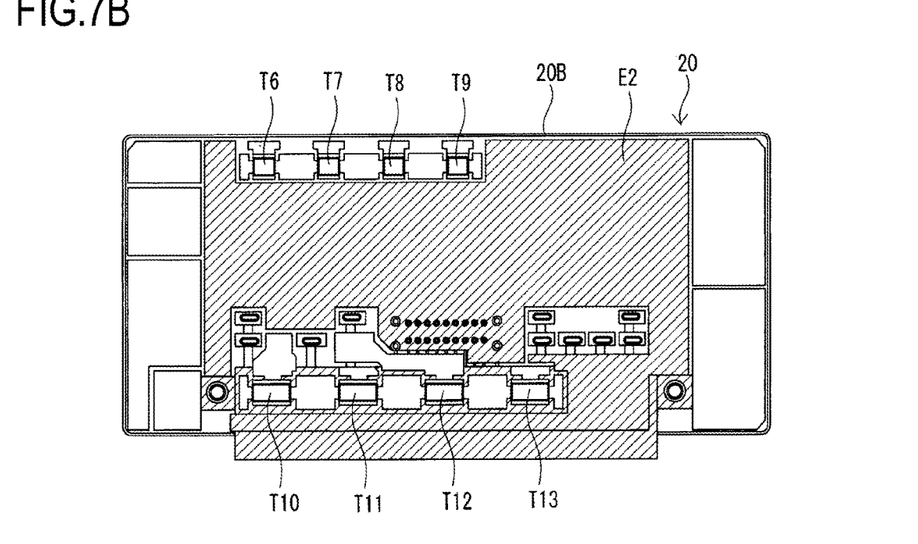
FIG. 7B is a plan view of an electronic substrate in the other surface (e.g. back surface) of the heatsink-less electronic unit shown in FIG. 7A when seen through from the one surface.

Similarly, heating components T6 to T9 are arranged in an end portion of an electronic substrate 20B in the other surface (back surface) of the heatsink-less electronic unit 20 and heating components T10 to T13 are arranged in the other end portion thereof. On the other hand, no heating component is arranged in the vicinity (hatching portion) of the center of the electronic substrate 20B as an arrangement area E2 for control components and signal lines. Thus, a measure against thermal interference can be taken in such a manner that only the layout of the heating components in the end portions of the electronic substrate is arranged without using any heat radiating component such as any heatsink or any metal core substrate in the same manner as in the aforementioned Embodiment 1.

SUMMARY

Thus, few signal lines or output current conducting patterns are arranged in the internal layers in the end portions of the electronic substrates 20A and 20B in comparison with the center areas of the electronic substrates 20A and 20B where lots of electronic components are mounted. Accordingly, the copper foils of the respective layers of the electronic substrates 20A and 20B are provided and extended to be long respectively in the end portions of the electronic substrates 20A and 20B. Accordingly, Embodiment 2 pays attention to the fact that copper foils long enough to dissipate heat are provided in the respective layers. When the heating electronic components are arranged in the end portions of the electronic substrates 20A and 20B, heat generated from the electronic components is conducted to the copper foils of the respective layers through the through holes penetrating the copper foils from the copper foil in the electronic component mounting surface to the copper foil in the opposite surface. The heat conducted to the copper foils of the respective layers passes along the respective copper foils which are provided and extended to be long, and reaches cut portions at front ends of the copper foils. Thus, it is possible to attain a large heat radiation effect as a whole even without using any heat radiating component such as any heatsink or any metal core substrate.

Incidentally, the invention is not limited to the aforementioned embodiments but may be modified, improved, etc. suitably. Besides, the materials, shapes, sizes, numbers, locations, etc. of the respective constituent elements in the aforementioned embodiments are not limited but may be set desirably as long as they can achieve the invention.

Here, characteristics of the aforementioned embodiments of the heatsink-less electronic units according to the invention are summarized and listed briefly respectively in the following [1] to [3].

[1] A heatsink-less electronic unit (10) including: metal coreless electronic substrates (electronic substrates 10A and 10B); and a heatsink-less microcomputer (microcomputer 11) and various semiconductor relays (wiper relays 12H and 12L, head lamp relays 15R and 15L, and fog lamp relays 16R and 16L) which are mounted on the metal coreless electronic substrates (electronic substrates 10A and 10B); wherein: the heatsink-less microcomputer (microcomputer 11) is arranged on the metal coreless electronic substrate (electronic substrate 10A); and among the various semiconductor relays, ones (wiper relays 12H and 12L) which reach a highest temperature are separated at longest distances from a location where the heatsink-less microcomputer (microcomputer 11) is arranged, and the various semiconductor relays (wiper relays 12H and 12L, head lamp relays 15R and 15L, and fog lamp relays 16R and 16L) are arranged separately from one another.

[2] A heatsink-less electronic unit (20) including: metal coreless electronic substrates each of which is provided with three or more layers of copper foil conductive patterns (metal coreless electronic substrates 20A and 20B each of which is provided with three or more layers of copper foil conductive patterns); and a heatsink-less microcomputer (microcomputer 11) and various semiconductor relays (heating components T1 to T13) which are mounted on the metal coreless electronic substrates; wherein: the heatsink-less microcomputer (microcomputer 11) and the various semiconductor relays (heating components T1 to T13) are arranged respectively in end portions of the metal coreless electronic substrates (20A and 20B).

[3] The heatsink-less electronic unit (10, 20) according to the aforementioned [1] or [2], wherein: the various semiconductor relays include two or more among from wiper relays (12R and 12L), head lamp relays (15R and 15L) and fog lamp relays (16R and 16L).

According to the heatsink-less electronic unit according to the invention, the microcomputer which should be made to radiate heat by priority is arranged separately from the various semiconductor relays which are likely to generate heat respectively during running in the nighttime in rainy weather or the various semiconductor relays are arranged in, of the electronic substrates, the end portions high in cooling efficiency. In this manner, it is possible to prevent a plurality of heating components such as the semiconductor relays from thermally interfering with one another and reaching very high temperature locally even without using any heatsink or any metal core substrate. In addition, it is possible to contribute to miniaturization and space saving.

What is claimed is:

1. A heatsink-less electronic unit comprising:
a metal coreless electronic substrate; and
a heatsink-less microcomputer and various semiconductor relays which are mounted on the metal coreless electronic substrate,
wherein the heatsink-less microcomputer is arranged on a front face of the metal coreless electronic substrate;
wherein among the various semiconductor relays, a plurality of wiper relays which reach the highest temperatures of the semiconductor relays are separated a longest distance from a location where the heatsink-less microcomputer is arranged, and the wiper relays are arranged on a front face of the metal coreless electronic substrate so as to be separated from one another, the front face being opposite to a rear face;
wherein among the various semiconductor relays, a plurality of head lamp relays are arranged on the rear face of the metal coreless electronic substrate so as to be separated from one another;
wherein the metal coreless electronic substrate has a rectangular shape including a long side and a sort side,
wherein the heatsink-less microcomputer is arranged at a region away from a center region of the metal coreless electronic substrate in a longitudinal direction of the metal coreless electronic substrate,
wherein a plurality of first semiconductor relays from among the various semiconductor relays are arranged on one end on the front face of the metal coreless electronic substrate in the longitudinal direction, the one end on the front face does not overlap the region, and the first semiconductor relays are aligned along the longitudinal direction in the one end on the front face, and
wherein a plurality of second semiconductor relays from among the various semiconductor relays are arranged on a region on the rear face corresponding to a region on the front face between the heatsink-less microcomputer and the one end on the front face of the metal coreless electronic substrate in a lateral direction, and the second semiconductor relays are aligned along the lateral direction in the region on the rear face.

2. A heatsink-less electronic unit comprising:
a metal coreless electronic substrate which is provided with three or more layers of copper foil conductive patterns, the metal coreless electronic substrate having a rectangular shape including a long side and a short side; and
a heatsink-less microcomputer and various semiconductor relays which are mounted on the metal coreless electronic substrate,
wherein a through hole is formed in an end portion of the metal coreless electronic substrate, passes through from the copper foil conductive pattern of a front face of the metal coreless electronic substrate to the copper foil conductive pattern of a rear face of the metal coreless electronic substrate, and is connected to the copper foil conductive pattern of each layer of the metal coreless electronic substrate, and the through hole being arranged in at least one of both end portions in a longitudinal direction of the metal coreless electronic substrate; and
wherein the heatsink-less microcomputer is arranged at a center region on the front face of the metal coreless electronic substrate;
wherein a plurality of first semiconductor relays from among the various semiconductor relays are arranged on both ends on the front face of the metal coreless electronic substrate in the longitudinal direction, the both ends on the front face do not overlap the center region, and the first semiconductor relays are aligned along a lateral direction of the metal coreless electronic substrate in the both ends on the front face; and
wherein a plurality of second semiconductor relays from among the various semiconductor relays are arranged on both ends on the rear face of the metal coreless electronic substrate in the lateral direction, and the second semiconductor relays are aligned along the longitudinal direction in the both ends on the rear face.

3. The heatsink-less electronic unit according to claim 1, wherein the various semiconductor relays include two or more among a wiper relay, a head lamp relay and a fog lamp relay.

4. The heatsink-less electronic unit according to claim 2, wherein the various semiconductor relays include two or more among a wiper relay, a head lamp relay and a fog lamp relay.

5. The heatsink-less electronic unit according to claim 2, wherein the heatsink-less microcomputer and the various semiconductor relays are arranged respectively in end portions of a first layer of the metal coreless electronic substrate, wherein a copper foil, provided in the end portions of the first layer of the metal coreless electronic substrate and connected to the various semiconductor relays, is connected to a copper foil of another layer of the metal coreless electronic substrate other than the first layer via a through hole of the first layer, and wherein a copper foil, provided on a center area of the first layer of the metal coreless electronic substrate, is not connected to copper foils of another layer of the metal coreless electronic substrate other than the first layer.

* * * * *